United States Patent [19]

Mahawili

[11] Patent Number: 4,550,684

[45] Date of Patent: Nov. 5, 1985

[54] COOLED OPTICAL WINDOW FOR SEMICONDUCTOR WAFER HEATING

[75] Inventor: Imad Mahawili, Sunnyvale, Calif.

[73] Assignee: Genus, Inc., Mt. View, Calif.

[21] Appl. No.: 522,638

[22] Filed: Aug. 11, 1983

[51] Int. Cl.$^4$ .............................................. C23C 13/08
[52] U.S. Cl. .................................. 118/724; 118/725; 118/50.1; 118/641; 219/343
[58] Field of Search ...................... 118/724, 725, 50.1, 118/641, 719, 620; 427/55; 219/405, 343, 347, 349, 354, 345; 313/35, 36

[56] References Cited

U.S. PATENT DOCUMENTS

| | | | |
|---|---|---|---|
| 3,105,916 | 10/1963 | Marker et al. | 313/35 |
| 3,316,387 | 4/1967 | Waldron | 219/343 |
| 3,862,397 | 1/1975 | Anderson et al. | 118/724 |
| 4,258,658 | 3/1981 | Politycki et al. | 118/724 |
| 4,409,511 | 10/1983 | Loda et al. | 313/34 |

OTHER PUBLICATIONS

AG Associates, *Heatpulse, Rapid Wafer Heating System*, Copyright 1982, pp. 1–14, (Advertisement).

"Heat Pulse Annealing of Arsenic–Implanted Silicon with a CW Arc Lamp," by Arnon Gat, IEEE Electron Device Letters, vol. EDL-2, No. 4, Apr. 1981.

"Activation of Arsenic–Implanted Silicon using an Incoherent Light Source," by R. A. Powell, et al., Applied Physics Letters, vol. 39, No. 2, Jul. 15, 1981.

"Radiation Annealing of Boron–Implanted Silicon with a Halogen Lamp," by Kazuo Nishiyama, et al., Japanese Journal of Applied Physics, vol. 19, No. 10, Oct. 1980.

"Incoherent Annealing of Implanted Layers in GaAs," by D. E. Davies et al., IEEE Electron Device Letters, vol. EDL-3, No. 4, Apr. 1982.

"Radiation Annealing of GaAs Implanted with Si," by Michio Arai, et al., Japanese Journal of Applied Physics, vol. 20, No. 2, Feb. 1981, pp. L124–L126.

*Primary Examiner*—John D. Smith
*Assistant Examiner*—Bernard F. Plants
*Attorney, Agent, or Firm*—Joseph H. Smith

[57] ABSTRACT

A vapor deposition system is provided which uses electromagnetic radiation for heating of a semiconductor wafer. The source of the electromagnetic radiation is typically a lamp having a color temperature corresponding to a wavelength in the range of 0.3 to 0.9 micrometers, and generally for a particular semiconductor to an energy greater than the energy required to cause transitions from the valence band to the conduction band of the semiconductor material used to construct the wafer and more preferably to a color temperature corresponding to an energy substantially at or above the energy required for direct (vertical) transitions from the valence band to the conduction band, thereby providing very high absorption of the incident radiation and very efficient direct heating of the wafer. No substrate is required for conducting heat to the wafer. The radiation is directed by a reflector through a window forming one side of the deposition chamber and impinges directly on the surface of the wafer. Although the window is typically chosen to be substantially transparent at the frequencies desired for heating the wafer, some absorption does occur, thereby heating the window as well. To maintain optimum control over the deposition process, the window is typically constructed with two spaced-apart plates and water is pumped therethrough to actively control window temperature.

11 Claims, 3 Drawing Figures

Energy band structure of silicon.
The valence band edge is at $\Gamma'_{25}$; the conduction band edge is along $\Delta_1$.
Spin-orbit interaction has not been considered in this figure.

COOLED OPTICAL WINDOW FOR SEMICONDUCTOR WAFER HEATING

TECHNICAL FIELD

This invention relates to an apparatus for the heating of semiconductor wafers in a vapor deposition system with electromagnetic radiation, and more particularly to a cooled optical window for transmitting such radiation.

BACKGROUND OF THE INVENTION

In a typical expitaxial reactor, it is common to use an evacuated quartz bell jar to house the wafer on which deposition is desired and a supporting substrate adjacent to the wafer. The wafer and substrate are then irradiated by an external source, generally infrared radiation, to bring the wafer to the required temperature for the desired chemical reactions to occur. In the most common configurations, the wafer is typically of silicon, the substrate is of graphite or graphite coated with silicon carbide, and the wavelength typically used for heating the silicon is generally from about 2 to 10 micrometers.

Such a configuration is, however, very inefficient for the heating of silicon wafers, since in this range of infrared wavelengths, silicon is substantially transparent, exhibiting an absorption coefficient typically less than 100/cm, and more often less than about 10/cm. Considering this low coefficient of absorption, it is likely that a significant portion of the heating of the wafer occurs by conduction from the graphite substrate which acts as a good absorber, rather than by absorption of the infrared in the wafer itself. Because of this rather indirect heating process, reactor design can often become the fine art of choosing the proper substrate materials.

For technical and economic reasons, it would be very beneficial to be able to heat semiconductor wafers directly in a reactive gas stream without the use of a supporting substrate for conductively heating the wafer. In particular, it would enable chemical reactions to take place directly only at the surface of the heated wafer rather than on both the wafer and its heated substrate.

SUMMARY OF THE INVENTION

In accordance with the preferred embodiments of the invention, a vapor deposition system is provided which uses electromagnetic radiation for heating of a semiconductor wafer. The radiation is directed by a reflector through a window forming one side of the deposition chamber and impinges directly on the surface of the wafer. Although the window is typically chosen to be substantially transparent at the frequencies desired for heating the wafer, some absorption does occur, thereby heating the window as well. Therefore, to control deposition stoichiometry, the window is typically constructed with two spaced-apart plates for permitting water to flow therethrough, in order to maintain the window at a desired temperature.

The source of the electromagnetic radiation is typically a metal halide lamp having a color temperature corresponding to a wavelength in the range of 0.3 to 0.9 micrometers. As a further improvement, for more efficient heating of a particular semiconductor, the color temperature can be chosen within this region to correspond to an energy greater than the energy required to cause transitions from the valence band to the conduction band of the semiconductor material used to construct the wafer, and more preferably to a color temperature corresponding to an energy substantially at or above the energy required for vertical transitions from the valence band to the conduction band, thereby providing very high absorption of the incident radiation and very efficient direct heating of the wafer. No substrate is required for conducting heat to the wafer.

DETAILED DESCRIPTION OF THE INVENTION

Figure 1:
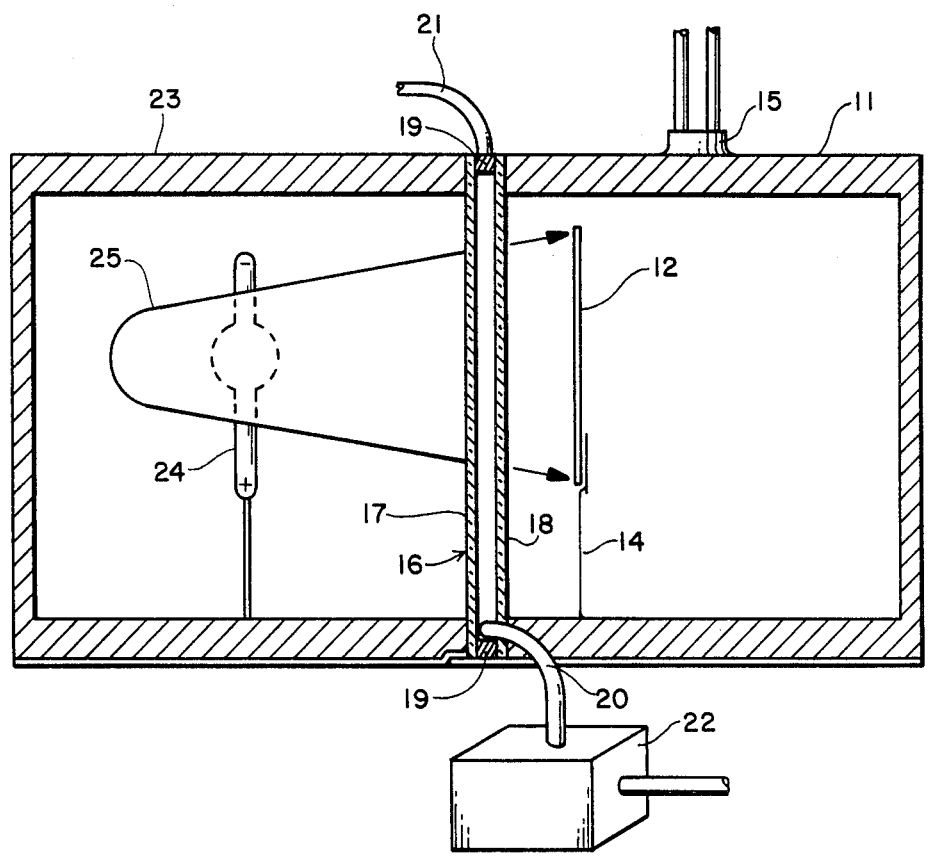
FIG. 1 shows a chemical vapor deposition chamber according to the invention.

In accordance with the preferred embodiments of the invention, shown in FIG. 1 is a deposition chamber 11, typically constructed of aluminum, containing a semiconductor wafer 12, which is minimally supported at its periphery by a support stand 14 located near the middle of housing 11. Reactant gases are introduced into the deposition chamber through diffusion chamber 15. Support stand 14 is generally of the rim-contact point-support type to permit direct exposure of nearly 99% of the wafer surface and does not involve the use of a substrate placed directly against the wafer surface for conducting heat to the wafer. Chamber 11 is bounded on one side by a window 16 which is typically made up of two parallel quartz plates 17 and 18 that are transparent at the frequencies of interest, each welded to a spacer 19 circumscribing the perimeter of the plates to form a cavity therebetween. Window 16 also has an inlet 20 at the bottom and an outlet 21 at the top for passing a temperature control fluid, preferably water, from pump 22 through the cavity in order to actively control the temperature of window 16 for optimum deposition. Typical temperature control fluids are water, air, or the like, but water is preferred. The quartz plates are usually about 8 to 15 inches square and ¼ to ½ inches thick, with the spacer typically ½ to 1 inch wide, to provide a cavity of that same width. Typical spacer materials include quartz and/or metal.

Figure 2:
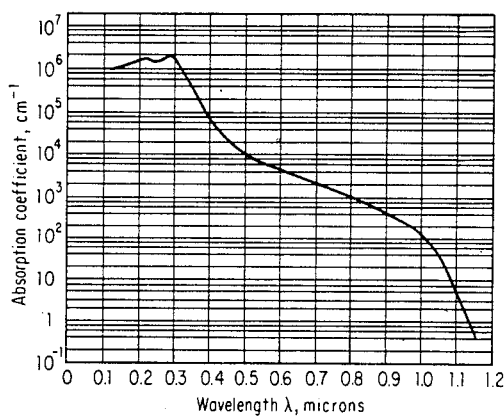
FIG. 2 is a graph of the room temperature optical absorption coefficient of silicon versus wavelength.

On the other side of window 16 is a second chamber 23 which houses a lamp 24 and a reflector 25. Lamp 24 is used to supply the radiant energy to heat wafer 12, and reflector 25 is for directing the energy from lamp 24 to the wafer. Unlike typical prior art devices, lamp 24 is not an infrared device, but instead is of the metal halide variety and, for most semiconductor wafers, is typically chosen to produce light substantially in the visible region, i.e., in the region of 0.3 to 0.9 micrometers. For silicon, operating in this region promotes high efficiency in the heating of the wafer, since for light between about 0.3 micrometers and 0.9 micrometers, the absorption coefficient for silicon ranges between 400/cm and 1,000,000/cm, the higher absorption occurring at the shorter wavelengths, whereas above about 1.1 micrometers, in the infrared, the absorption coefficient decreases sharply and silicon becomes essentially transparent. (See FIG. 2.)

Figure 3:
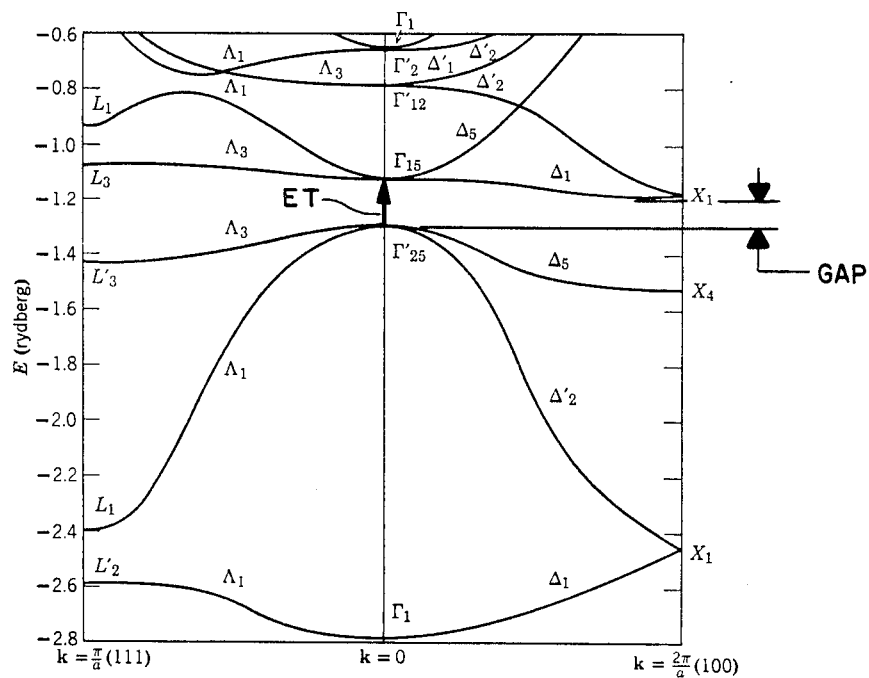
FIG. 3 shows the band structure of silicon.

This high absorption is thought to be due to carriers being raised from the valence band to the conduction band, the band gap for silicon being about 1.15 eV and corresponding to a wavelength of about 1.08 micrometers. As can be seen from the band structure of silicon shown in FIG. 3, however, this minimum band gap does not occur for vertical transitions but instead occurs at different wavevectors, so that the two states cannot be connected by an allowed optical (vertical) transition. The threshold energy, ET, for strong optical absorption then would be expected to lie near the minimum energy for vertical transitions, which occurs at about 2.5 eV or at a corresponding wavelength of about 0.50 micrometers, as appears to be verified by noting the sharp increase in the slope of the absorption curve occuring at 0.50 micrometers. (See FIG. 2.) At lower energies, i.e. below ET, the increased absorption is thought to be due to phonon-assisted transitions, that is vertically by absorption of a photon and then to the appropriate minimum in the conduction band by emission or absorption of a phonon of a large enough wavevector. The probability of these phonon-assisted transitions, however, is typically smaller than for direct (vertical) transitions, thus leading to a smaller absorption coefficient. Also, these transitions have some temperature dependence since the transition probability depends on the occupancy of the phonon states in the crystal.

At the same time that an electron is raised to the upper band, a hole is created in the lower band, typically leading either to bound electron-hole pairs or, at higher energies of incident radiation, to essentially free electrons and free holes. At the temperatures of interest, the interaction of the electrons and holes with lattice vibrations is thought to be sufficiently high to effectively limit the lifetime of the electrons and holes as bound states or as free carriers, so that a substantial portion of their kinetic energy is quickly converted to thermal energy, thereby raising the temperature of the crystal. Hence, it is very beneficial to use a lamp having a frequency corresponding to an energy greater than the band gap, or more preferably to an energy at or above the energy for direct transitions between the valence band and the conduction band, rather than an infrared lamp having an energy below the band gap. As a practical matter, however, high power lamps usually have a spectrum of energies which they emit rather than a single frequency, so that what is desired is a lamp having a range of frequencies corresponding to the regions of high absorption of the wafer. With this in mind, it is more useful to discuss the output of the lamp in terms of a measure related to its spectral density, e.g. its Wein color temperature. Hence, a practical lamp for the efficient heating of semiconductor wafers can be characterized as having a color temperature corresponding to an energy above the band gap (which for silicon would correspond to a color temperature above about 2700 degrees K.) and preferably substantially at or above the energy for direct transitions between the valence band and the conduction band (which would correspond to a color temperature of about 5800 degrees K.).

Experimentally it has been found that a particularly efficient system for heating silicon wafers is to use a tungsten halide arc lamp having a color temperature of about 5600 degrees K. For example, for a 1.5 kW lamp with this characteristic temperature, a wafer positioned approximately 2 inches from the window can be heated to about 500 degrees C. in about 70 seconds, and with a 2.5 kW lamp of the same type, the wafer temperature can be raised to about 700 degrees C. in about 90 seconds. Furthermore, even higher wafer temperatures appear to be easily attainable. In addition it is not surprising that this color temperature of 5600 degrees K., even though it is somewhat lower than the optimum range discussed above, is quite efficient in heating the wafers since the tails of the energy distribution of the lamp overlap sufficiently into the region above the energies for direct transition. This is thought to be generally true, so that if the color temperature chosen is even as much as 20% below the temperature for direct transitions, the heating will still be quite efficient. More specifically, if the color temperature corresponding to the energy required for direct transitions is T1, then it is beneficial to heating efficiency if the lower bound of the color temperature chosen for lamp 24 is greater than about 0.8 T1, and it is even more preferable if it is chosen to be greater than T1.

For the same reason that color temperature is a useful parameter for description of the desired lamp characteristics, the composition of window 16 is also a relevant consideration. Since, lamp 24 will typically emit at least some radiation in the infrared and since it is desirable that as much of the radiation introduced into chamber 11 as possible be absorbed by the wafer rather than by the chamber walls, it would be very beneficial if the infrared from lamp 24 be absorbed in window 16. Since water is known to have strong absorption in the infrared, the infrared will be absorbed directly in the water if plate 17 of window 16 adjacent to reflector 25 transmits infrared. Similarly, efficient heating of the wafer dictates that both plates used for window 16 be very transparent at the energies corresponding to optimal wafer heating. For these reasons, and as indicated earlier, quartz has been found highly desirable for construction of the plates. Other materials can also be used, however, one such example being glass.

A particularly important benefit of directly heating the wafer through the temperature controlled window and avoiding the use of a substrate for conducting heat to the wafer is that all surfaces within the deposition chamber having any substantial area can be easily maintained at whatever temperature is desired, the window by means of pumped fluid and the balance of deposition chamber 11 by whatever means may be chosen. Such control is very beneficial in obtaining the desired stoichiometry of the deposited materials.

Those skilled in the art will realize that the principles described above apply to semiconductors other than silicon, e.g., such as gallium arsenide. For example, the band gap (and threshold energy for direct transitions) for gallium arsenide is about 1.4 eV corresponding to a minimum desirable color temperature of about 3280 degrees K. Hence, it would be expected that a lamp having a color temperature of 5600 degrees K. as in the previous example would still be satisfactory since it is higher than the minimum desirable color temperature.

What is claimed is:

1. An apparatus for chemical vapor deposition on a wafer of semiconductor material comprising:
   housing means for containing said wafer;
   heating means external to said housing means for generating light for directly heating said wafer;
   window means interposed between said heating means and said wafer, for transmitting said light into the interior of said housing means and in the direction of said wafer, said window means comprising a first wall and a second wall with a space therebetween for channeling the flow of cooling liquid, with said second wall forming at least a portion of the innermost surface of said housing means, and said walls arranged such that said light passes through both of said walls and through said cooling liquid before impinging on said wafer; and fluid control means for actively cooling said second wall by pumping cooling liquid between said walls.

2. An apparatus as in claim 1 wherein said first wall comprises quartz.

3. An apparatus as in claim 2 wherein said second wall comprises quartz.

4. An apparatus as in claim 1, wherein said cooling liquid comprises water.

5. An apparatus as in claim 4 wherein said semiconductor is selected from the group consisting of silicon and gallium arsenide.

6. An apparatus as in claim 4 wherein said heating means comprises a metal halide lamp having a color temperature such that said heating of said wafer occurs substantially entirely by direct absorption of said light by said wafer.

7. An apparatus as in claim 6 wherein said heating means comprises a reflector for directing said light toward said wafer.

8. An apparatus as in claim 1 wherein said light has a color temperature corresponding to a wavelength in the range of 0.3 micrometers to 0.9 micrometers.

9. An apparatus as in claim 8 wherein said color temperature corresponds to an energy greater than the energy required to cause electronic transitions from the valence band to the conduction band of said semiconductor material.

10. An apparatus as in claim 8 wherein said color temperature corresponds to an energy above twenty percent below the temperature corresponding to the energy required for direct transitions from the valence band to the conduction band of said semiconductor material.

11. An apparatus as in claim 10 wherein said semiconductor material is selected from the group consisting of silicon and gallium arsenide.

* * * * *